(12) United States Patent
Gutsche et al.

(10) Patent No.: US 7,317,201 B2
(45) Date of Patent: Jan. 8, 2008

(54) METHOD OF PRODUCING A MICROELECTRONIC ELECTRODE STRUCTURE, AND MICROELECTRONIC ELECTRODE STRUCTURE

(75) Inventors: Martin Gutsche, Dorfen (DE); Harald Seidl, Poring (DE)

(73) Assignee: Infineon Technologies AG, Munich (DE)

(*) Notice: Subject to any disclaimer, the term of this patent is extended or adjusted under 35 U.S.C. 154(b) by 93 days.

(21) Appl. No.: 11/296,740

(22) Filed: Dec. 7, 2005

(65) Prior Publication Data
US 2006/0125108 A1    Jun. 15, 2006

(30) Foreign Application Priority Data
Dec. 9, 2004    (DE) .................. 10 2004 059 428

(51) Int. Cl.
    *H01L 47/00* (2006.01)
(52) U.S. Cl. .................. 257/4; 257/2; 257/3; 257/774; 257/E45.002
(58) Field of Classification Search .............. 257/4
    See application file for complete search history.

(56) References Cited

U.S. PATENT DOCUMENTS 6,348,733 B1 * 2/2002 Lin .................. 257/758
2003/0116794 A1 * 6/2003 Lowrey .................. 257/296
2004/0113232 A1 * 6/2004 Johnson et al. .............. 257/529

FOREIGN PATENT DOCUMENTS

| DE | 10339061 | 7/2004 |
|----|----------|--------|
| EP | 1318552 | 6/2003 |
| EP | 1469532 | 10/2004 |
| EP | 1475840 | 11/2004 |
| EP | 1480273 | 11/2004 |
| EP | 1505656 | 2/2005 |
| WO | WO 03/021693 | 3/2003 |

OTHER PUBLICATIONS

German Office Action dated Aug. 29, 2005.

* cited by examiner

*Primary Examiner*—Tu-Tu Ho
(74) *Attorney, Agent, or Firm*—Jenkins, Wilson, Taylor & Hunt, P.A.

(57) ABSTRACT

In a method for producing a microelectronic electrode structure a first wiring plane is prepared, an insulating region on the first wiring plane is provided, a through-hole in the insulating region is formed, a ring electrode in the through-hole is formed, and a second wiring plane is formed on the insulating region. The ring electrode comprises a first side and a second side, the ring electrode is electrically connected on the first side to the first wiring plane, and the second wiring plane is electrically connected to the second side of the ring electrode.

10 Claims, 21 Drawing Sheets

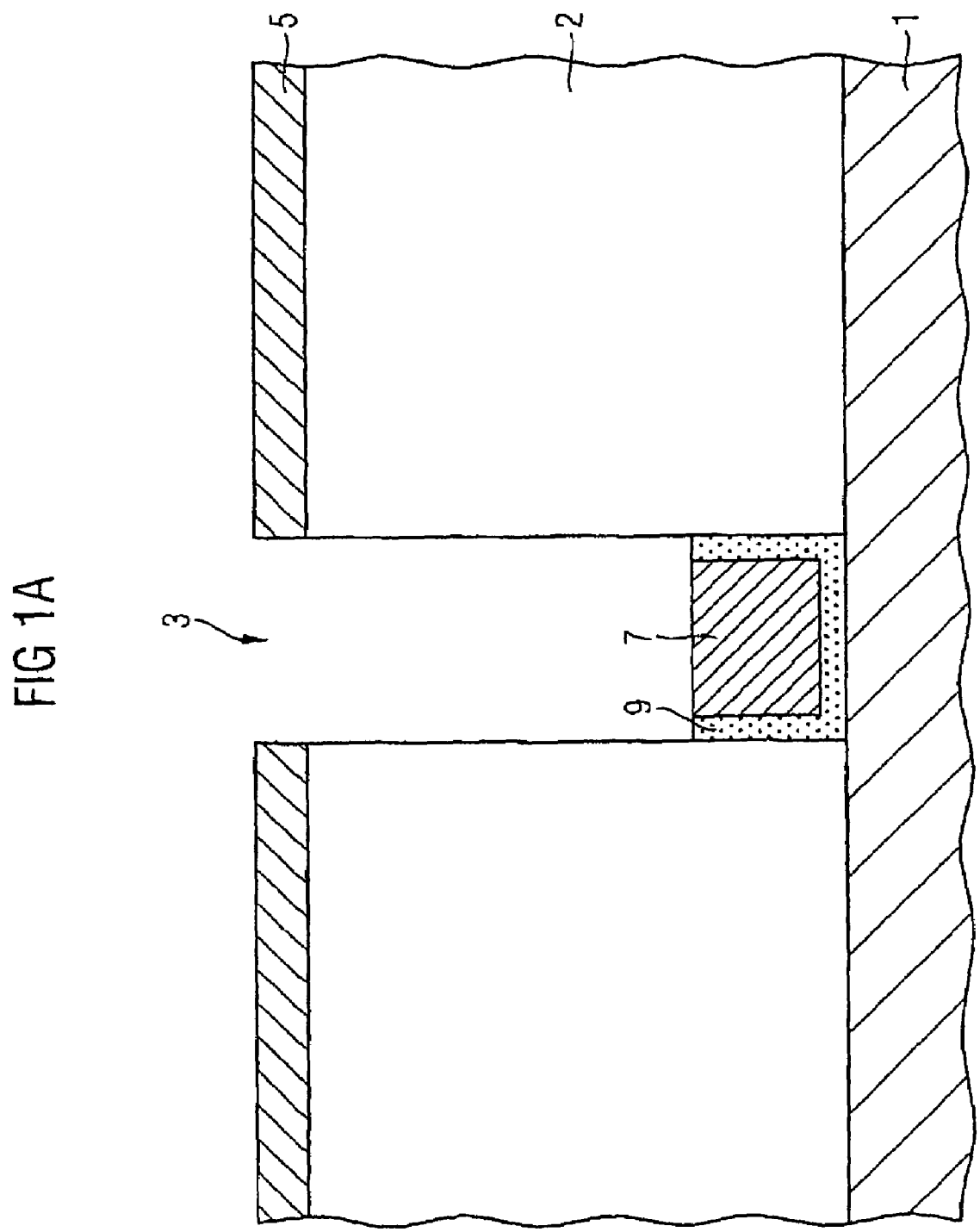

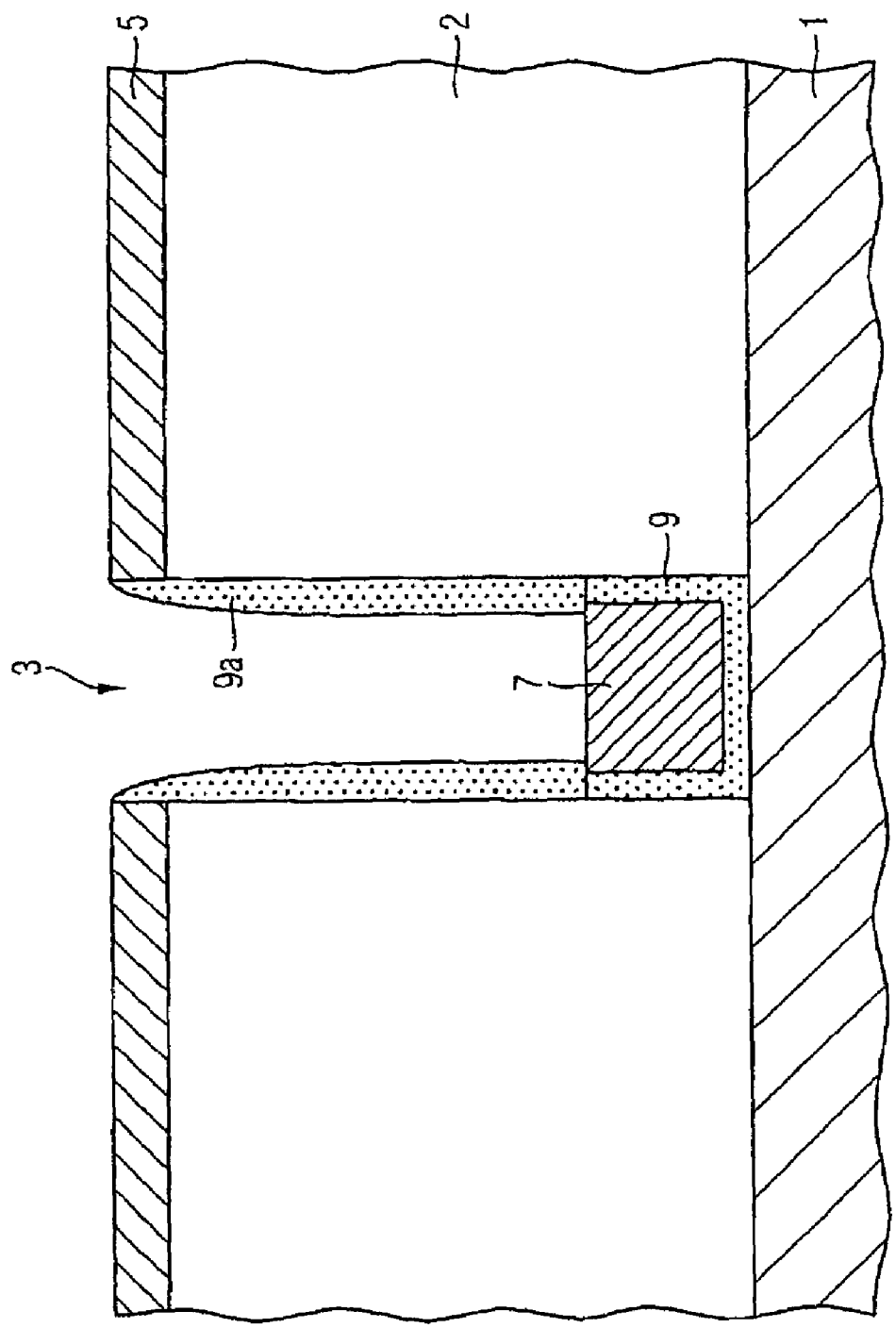

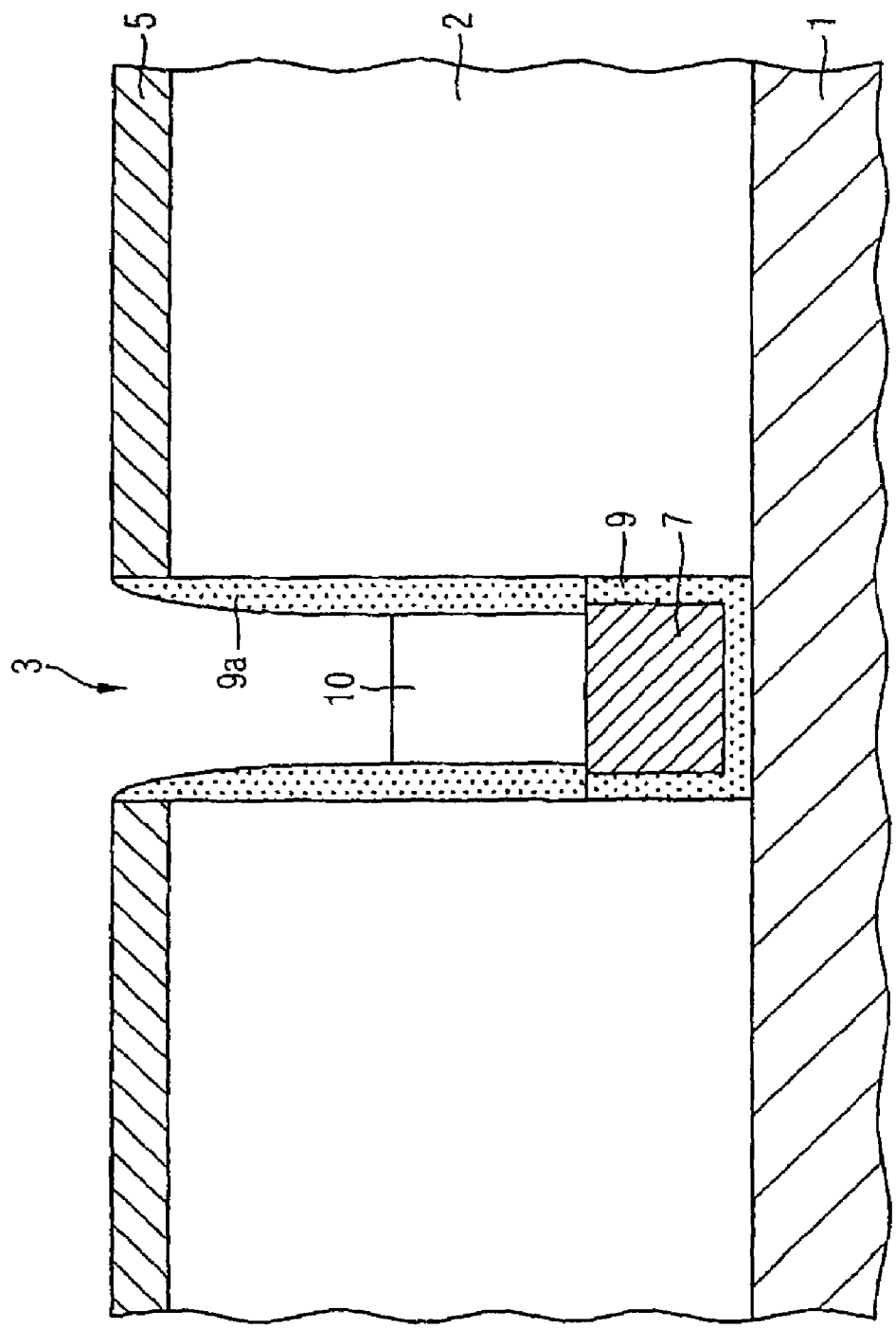

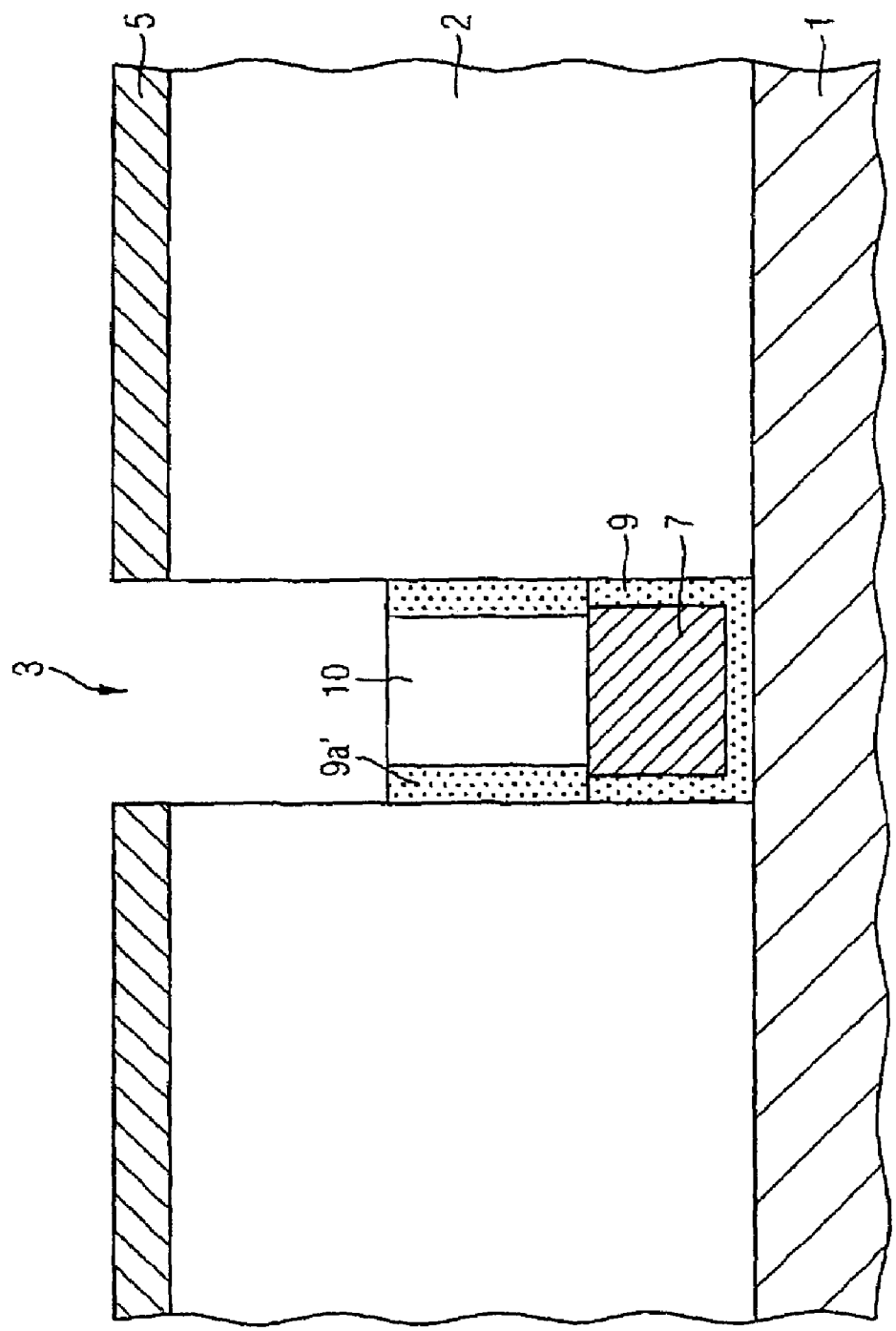

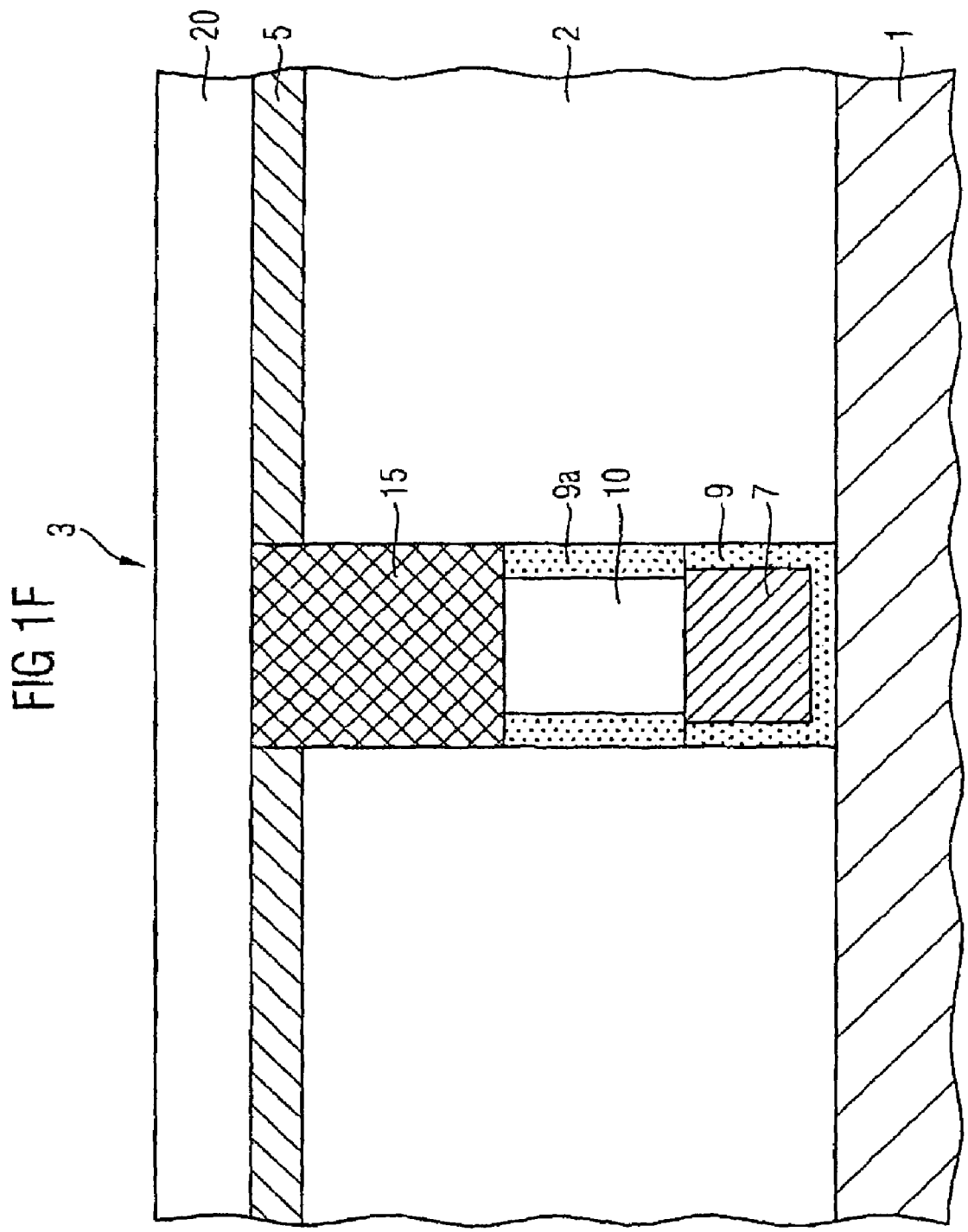

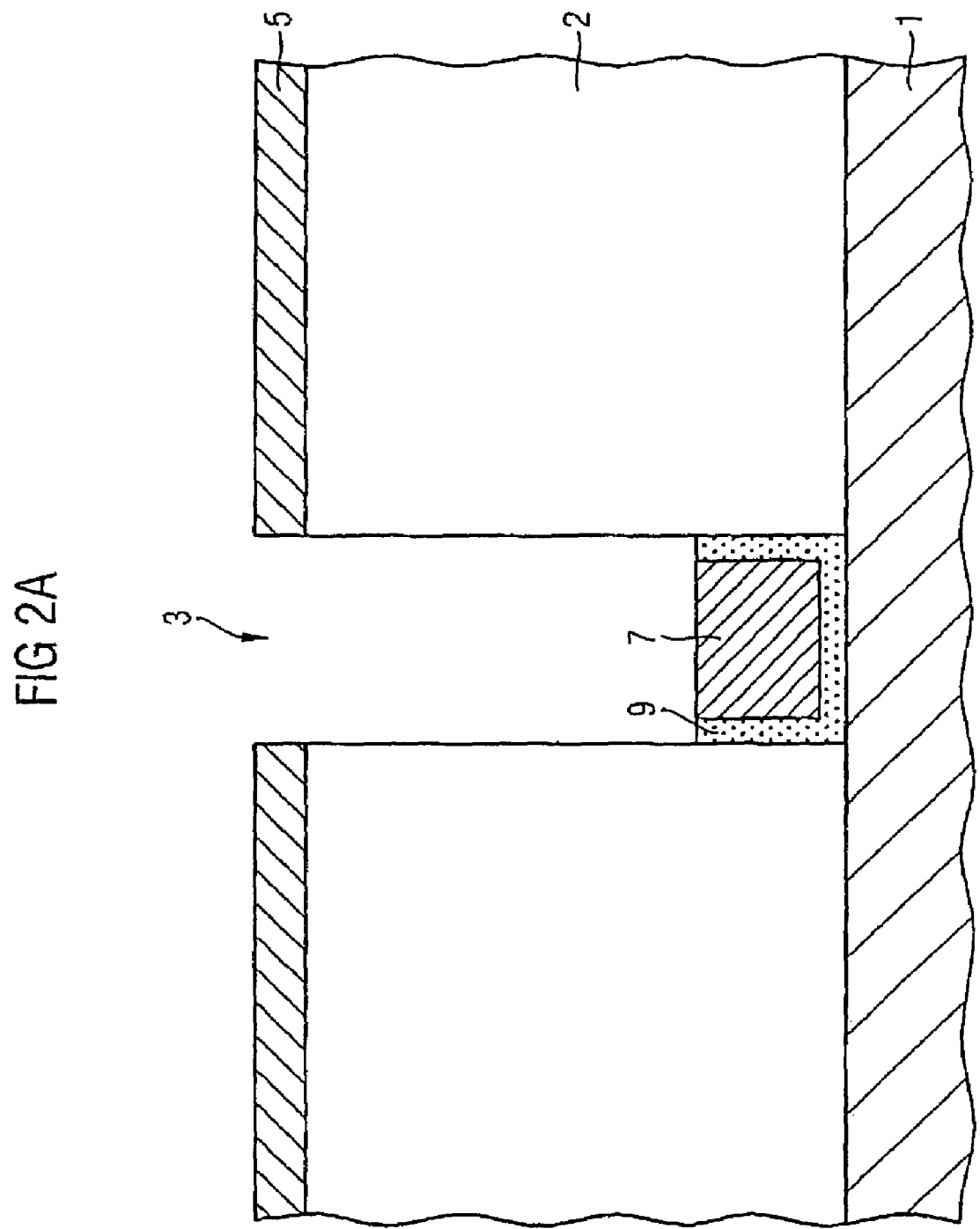

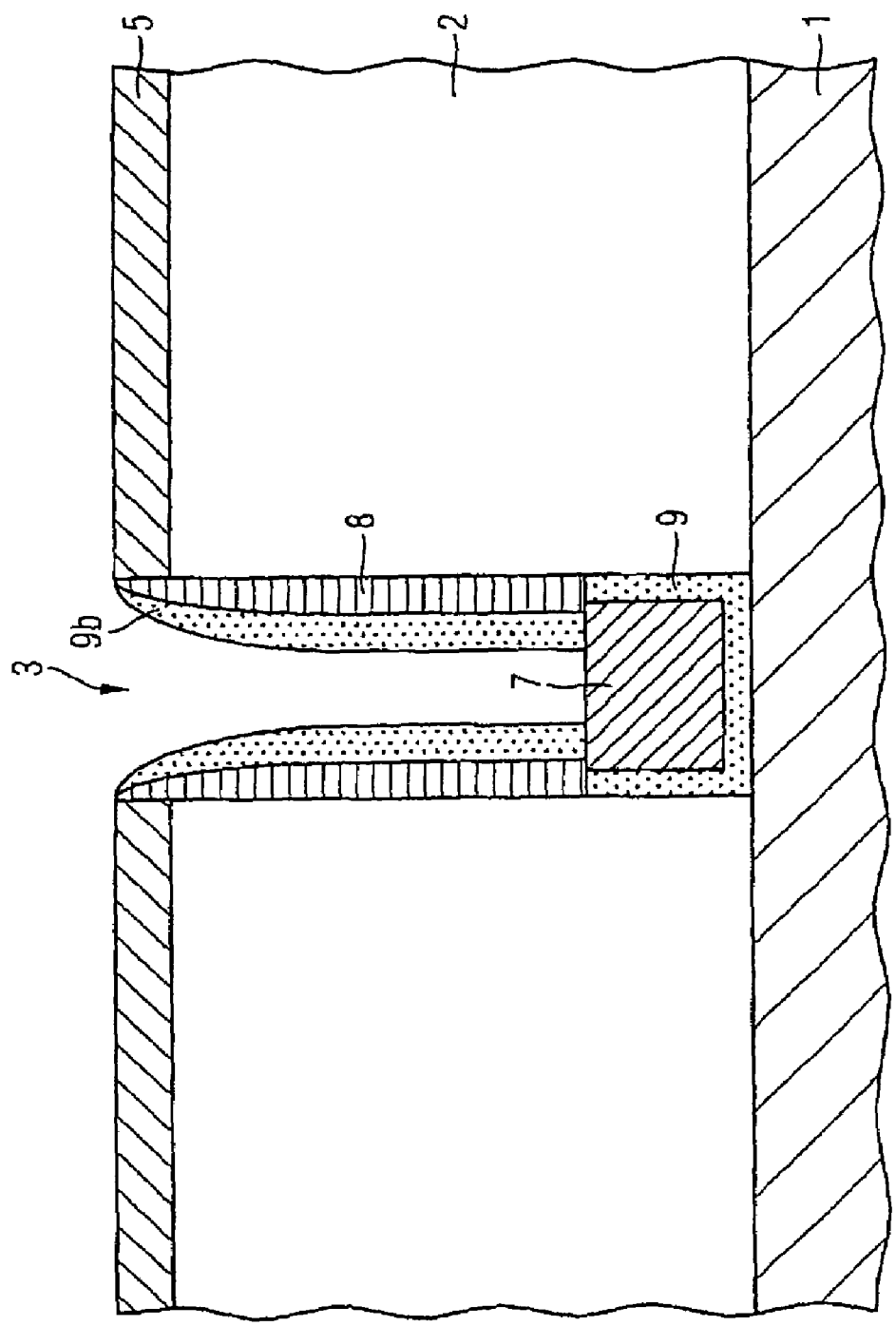

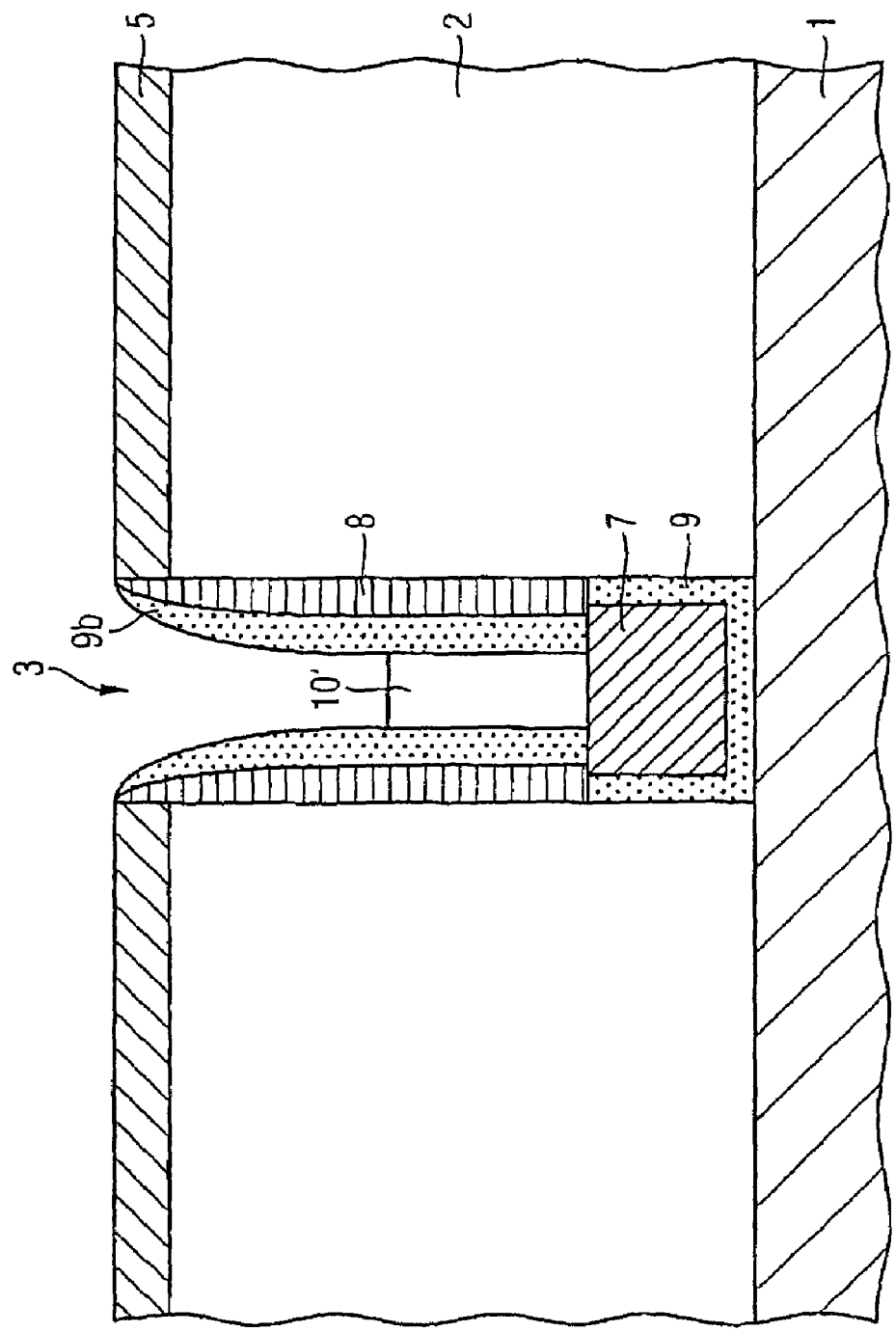

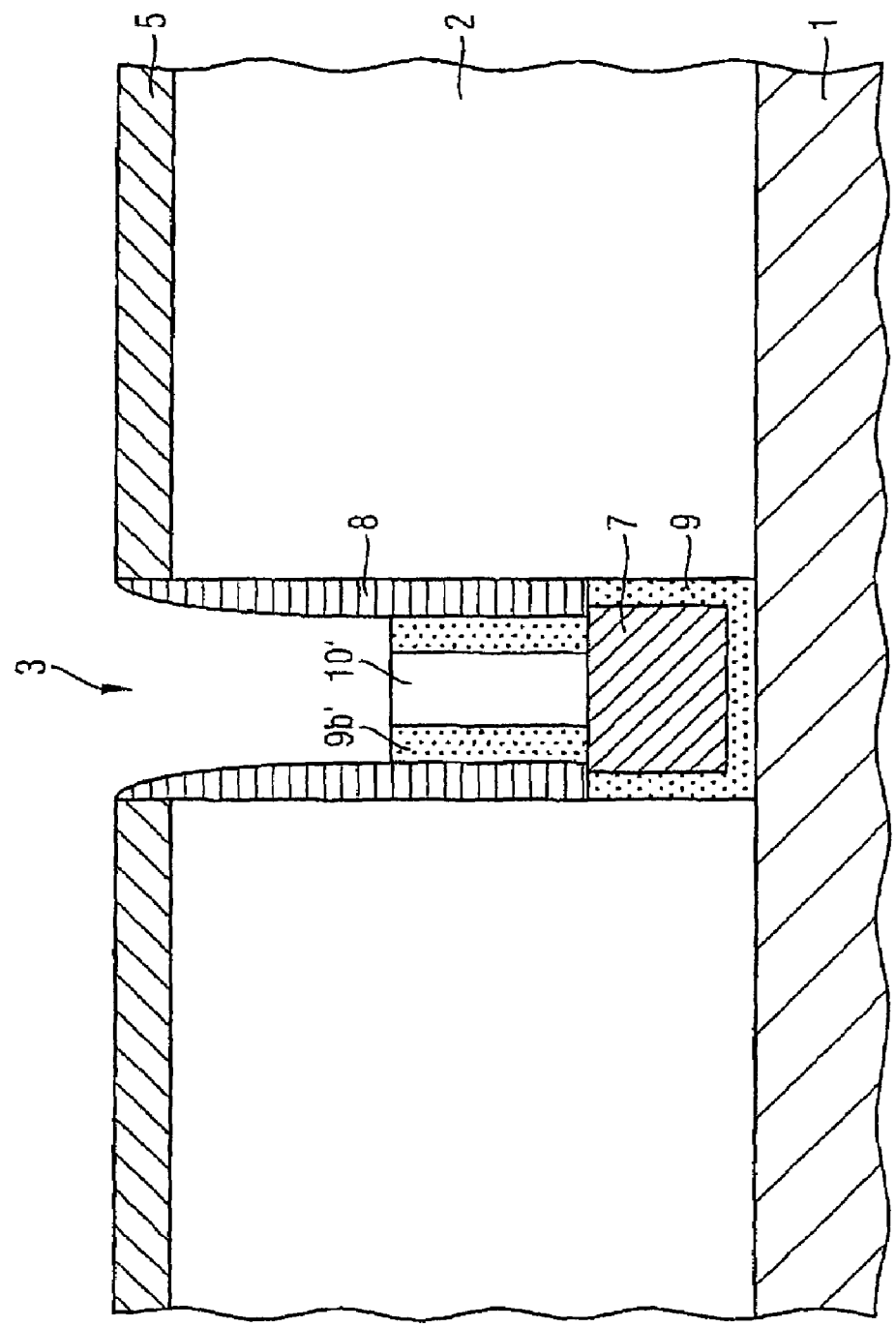

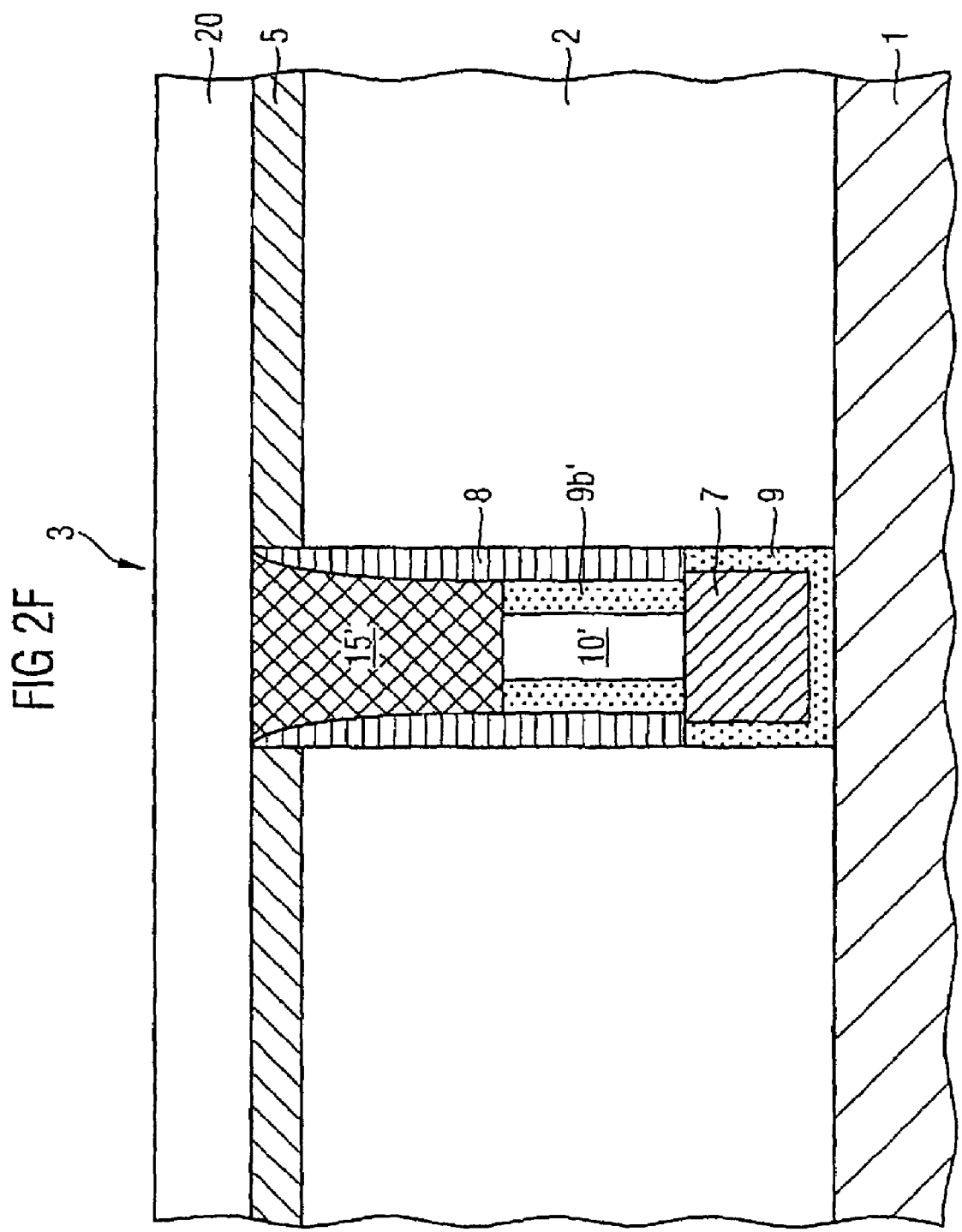

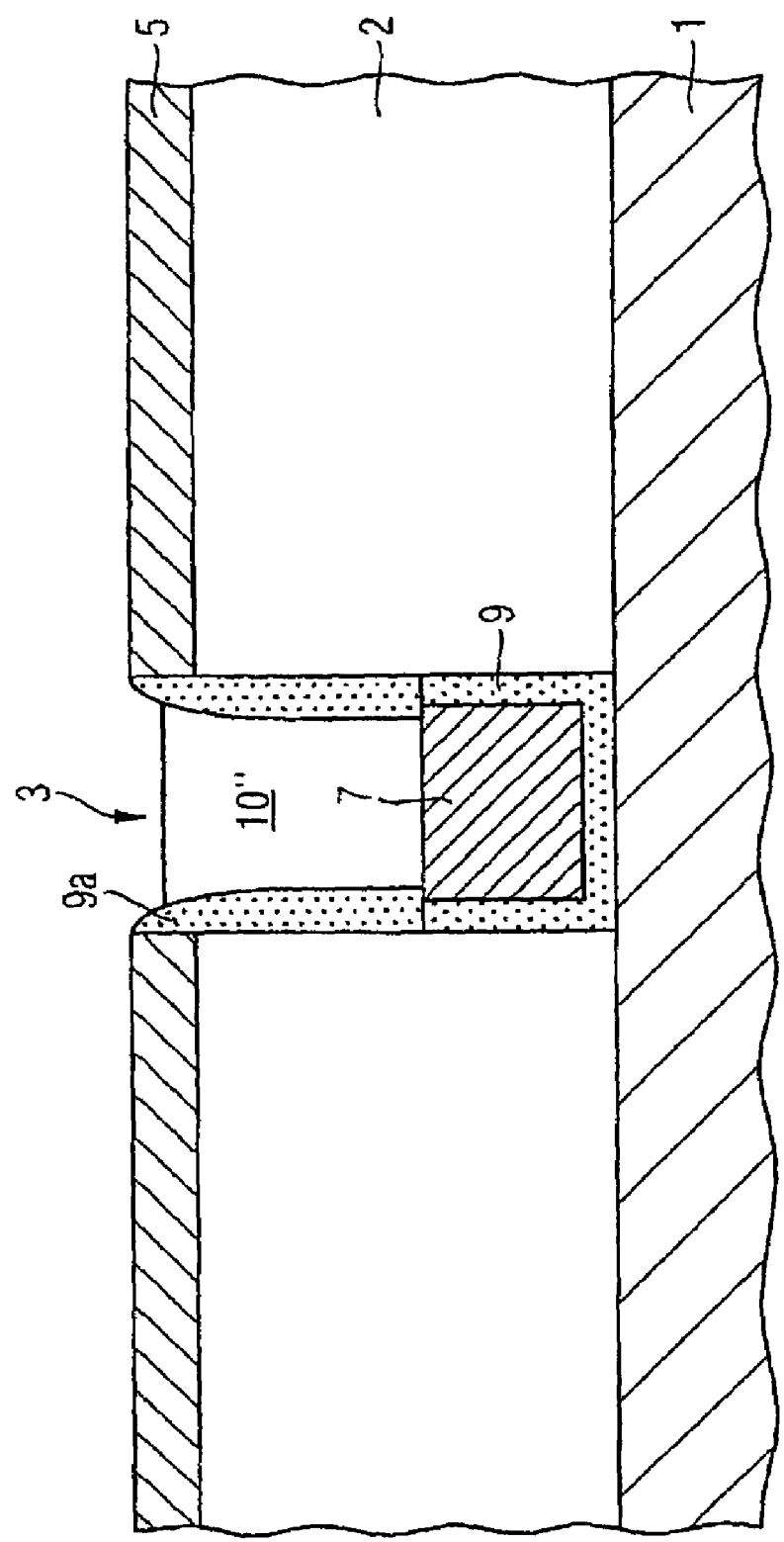

METHOD OF PRODUCING A MICROELECTRONIC ELECTRODE STRUCTURE, AND MICROELECTRONIC ELECTRODE STRUCTURE

BACKGROUND OF THE INVENTION

1. Field of the Invention

The present invention relates to a method of producing a microelectronic electrode structure, in particular for a PCM memory element, and to a corresponding microelectronic electrode structure.

2. Description of the Prior Art

Although in principle it can be applied to any desired microelectronic electrode structure, the present invention and the problems on which it is based are explained on the basis of PCM (phase change memory) memory elements.

U.S. Pat. No. 5,166,758 discloses a PCM (phase change memory) memory element in the case of which electrical energy is used for converting a PCM material, typically chalcogenide alloys (e.g. $G_2Sb_2Te_5$), between the crystalline phase (high conductivity, logical "1") and the amorphous phase (low conductivity, logical "0").

The conversion from the amorphous phase into the crystalline phase requires a thermal pulse with a temperature which is higher than the glass transition temperature but lower than the melting temperature, whereas the conversion from the crystalline phase into the amorphous phase requires a thermal pulse with a temperature greater than the melting temperature followed by rapid cooling.

In the case of the above example of $Ge_2Sb_2Te_5$, the melting temperature is about 600° C. and the glass transition temperature is about 300° C. The crystallisation time is typically around 50 ns.

PCM memory elements of this type have a whole series of advantageous properties, for example non-volatility, direct overwritability, non-destructive readability, rapid writing/erasing/reading, long service life ($10^{12}$ to $10^{13}$ read/write cycles), high packing density, low power consumption and good integratability with standard semiconductor processes. In particular, the previously known concepts of SRAM, EEPROM and ROM can be combined in a PCM memory element.

One of the main problems with the known PCM memory elements is the relatively high heat generation during the programming and erasing operations. These problems are suitably remedied by reducing the contacted electrode area to increase the current density and consequently lower the energy consumption and the associated heat generation.

IEDM 200136,05, Stefan Lai and Tyler Lowrey, "OUM—A 180 nm Nonvolatile Memory Cell Element Technology for Stand Alone and Embedded Applications" provides a summary of the current state of development of PCM memory elements (also referred to there as "OUM" (Ovonic Unified Memory) memories) in 180 nm technology.

SUMMARY OF THE INVENTION

It is therefore the object of the present invention to provide a method of producing a microelectronic electrode structure, in particular for a PCM memory element, and a corresponding microelectronic electrode structure which make possible a further reduction of the size and consequently of the heat generation during operation as a PCM memory element.

The object is achieved in accordance with the invention by means of a method of producing a microelectronic electrode structure, in particular for a PCM memory element, with the steps of:

preparing a first wiring plane;

providing an insulating region on the first wiring plane;

forming a through-hole in the insulating region;

forming a ring electrode in the through-hole with a first side and a second side, which is electrically connected on the first side to the first wiring plane, by means of a spacer technique; and forming a second wiring plane on the insulating region, which is electrically connected to the second side of the ring electrode.

The object is also achieved in accordance with the invention by means of a microelectronic electrode structure, in particular for a PCM memory element, with:

a first wiring plane;

an insulating region on the first wiring plane;

a through-hole in the insulating region;

a ring electrode in the through-hole with a first side and a second side, which is electrically connected on the first side to the first wiring plane; and a second wiring plane on the insulating region, which is electrically connected to the second side of the ring electrode.

The idea on which the present invention is based is to use a sublithographic process to reduce the size of the contact area of the PCM memory element.

The inventive microelectronic electrode structure is suitable in particular for a PCM memory element with a hollow-cylindrical electrode below or above or below and above a resistively switchable PCM material (e.g. GST). On account of the low cross-sectional area, the current density is increased, and therefore the overall current can be reduced while the current density remains constant. Furthermore, uniform heating of the PCM material is brought about by the annular electrode structure. The annular electrode is sublithographically produced, it being possible for the entire layer stack with a lower electrode, PCM material and an upper electrode to be produced in a self-adjusted manner.

There may be formed, in the through-hole between the first wiring plane and the ring electrode, a contact plug, which is adjacent the first side of the ring electrode. The contact plug may have a Ti/TiN liner region and a tungsten region. The ring electrode may be filled with an insulating plug.

A region of a PCM material, which is adjacent the second side of the ring electrode may be formed between the in the through-hole between the ring electrode and the second wiring plane. The region of the PCM material may be completely in the through-hole, may be is in the through-hole and above the insulating region or may be outside the through-hole above the insulating region.

An insulating ring region may be formed by means of a spacer technique in the through-hole between the insulating region and the ring electrode This allows the diameter of the ring electrode to be made even smaller.

The insulating region may have a silicon oxide layer and a silicon nitride layer lying above it.

The ring electrode may be sunken into the through-hole with respect to the upper side of the insulating region.

DESCRIPTION OF THE DRAWINGS

FIG. 1A-1F are schematic representations of successive method stages of a method of producing a contact structure for a PCM memory element as a first embodiment of the present invention;

FIG. 2A-2F are schematic representations of successive method stages of a method of producing a contact structure for a PCM memory element as a second embodiment of the present invention;

FIG. 3A-3D are schematic representations of successive method stages of a method of producing a contact structure for a PCM memory element as a third embodiment of the present invention;

DESCRIPTION OF THE EMBODIMENTS

Figure 1E:
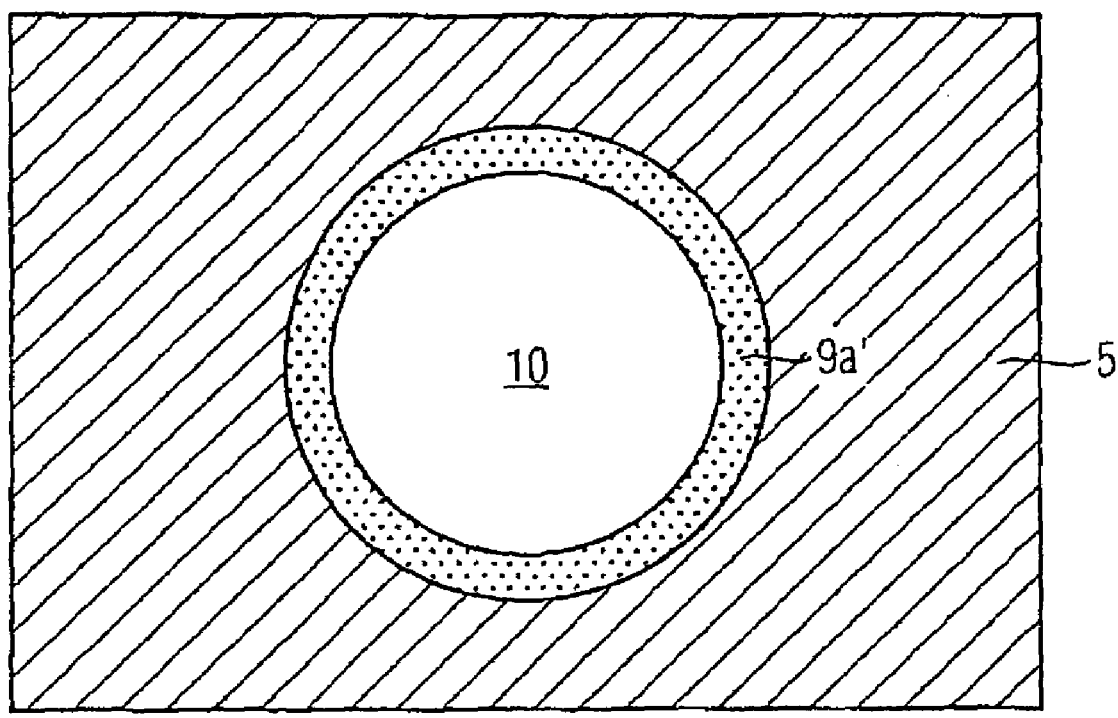

In the figures, the same reference numerals designate component parts that are the same or functionally the same.

FIGS. 1A-F show schematic representations of successive method stages of a method of producing a contact structure for a PCM memory element as a first embodiment of the present invention.

In FIG. 1A, reference numeral 1 designates a first wiring plane, which in the case of the present example is a metal plane. Applied to the first wiring plane 1 is an insulating region 2, 5 comprising a silicon oxide layer 2 and a silicon nitride layer 5 located on it, the latter silicon nitride layer 5 being used as a mask to form a through-hole 3, that is formed in the silicon oxide layer 2.

To form the structure shown in FIG. 1A, deposition of a Ti/TiN liner also takes place, for example 10 nm of titanium and subsequently 10 nm of titanium nitride, after which an annealing process is carried out to stabilize this double liner. This is followed by carrying out a deposition of tungsten. The tungsten and the Ti/TiN liner 9 are subsequently etched back, in order to form in the lower region of the through-hole 3 a contact plug 7, 9, which is in electrical contact with the first wiring plane 1. In this connection it should be noted that the etching-back of the Ti/TiN liner 9 is optional.

Furthermore, with reference to FIG. 1B, a TiN layer is then deposited over the resulting structure and a TiN spacer 9a is formed from it on the side walls of the through-hole 3 by means of spacer etching.

The TiN deposition is a conformal deposition and can be carried out for example by means of an ALD or CVD method. As is known, the spacer etching is anisotropic.

Furthermore, with reference to FIG. 1C, a silicon oxide layer 10 is then deposited over the resulting structure and etched back in the through-hole 3, so that an insulating plug 10 of silicon oxide remains behind in the through-hole 3 on the tungsten region 7 and between the TiN spacer 9a.

As represented in FIG. 1D, this is followed by an isotropic etching of the titanium nitride spacer 9a as far as the upper side of the insulating plug 10 of silicon oxide, in order to form from it a ring electrode 9a', which is located within the through-hole 3 and is filled by the insulating plug 10. The ring electrode 9a' thereby contacts the contact plug 7, 9 both in the region of the liner 9 of Ti/TiN and in the tungsten region 7.

FIG. 1E shows a plan view from above of the annular structure of the ring electrode 9a' in FIG. 1D becomes clear.

In a further process step, which is illustrated in FIG. 1f, a PCM material, e.g. $Ge_xSb_yTe_z$, is deposited over the resulting structure by means of a PVD or CVD method and taken back as far as the upper side of the silicon nitride layer 5, for example by an etching process or a CMP process.

Finally, a second wiring plane 20, which in the present example is likewise a metal plane, is formed above the resulting structure.

FIGS. 2A-F show schematic representations of successive method stages of a method of producing a contact structure for a PCM memory element as a second embodiment of the present invention.

The state of the process shown in FIG. 2A corresponds to the state of the process according to FIG. 1A.

Furthermore, with reference to FIG. 2B, this is followed by a conformal deposition of a silicon nitride layer by means of a CVD method and subsequently anisotropic spacer etching, in order to form in the through-hole 3 above the contact plug 7, 9 a silicon nitride spacer 8, which reduces the diameter of the hole remaining.

In the subsequent process step according to FIG. 2C, a conformal TiN deposition takes place, as in the case of the first embodiment above, by means of an ALD or CVD process and anisotropic spacer etching, in order to form a TiN spacer 9b on the silicon nitride spacer 8 in the through-hole 3.

With reference to FIG. 2D, this is then followed again in the case of the first embodiment above by a deposition and back-etching of a silicon oxide layer to form an insulating plug 10' in the through-hole 3 on the tungsten region 7 and in the ring region of the titanium nitride spacer 9b.

According to FIG. 2E, the titanium nitride spacers 9b are then etched back as far as the upper side of the insulating plug 10' of silicon oxide, in order to form a ring electrode 9b' of titanium nitride. Optionally, after that the silicon nitride spacer 8 could likewise be etched back as far as the upper side of the insulating plug 10 or the ring electrode 9b'.

In the subsequent process step, a PCM material is then deposited over the resulting structure and taken back as far as the upper side of the silicon nitride layer 5, in order to form a PCM region 15'.

As in the case of the first embodiment, the second wiring plane 20, which is a metal plane, is subsequently formed above this structure.

FIGS. 3A-D show schematic representations of successive method stages of a method of producing a contact structure for a PCM memory element as a third embodiment of the present invention.

Figure 2B:
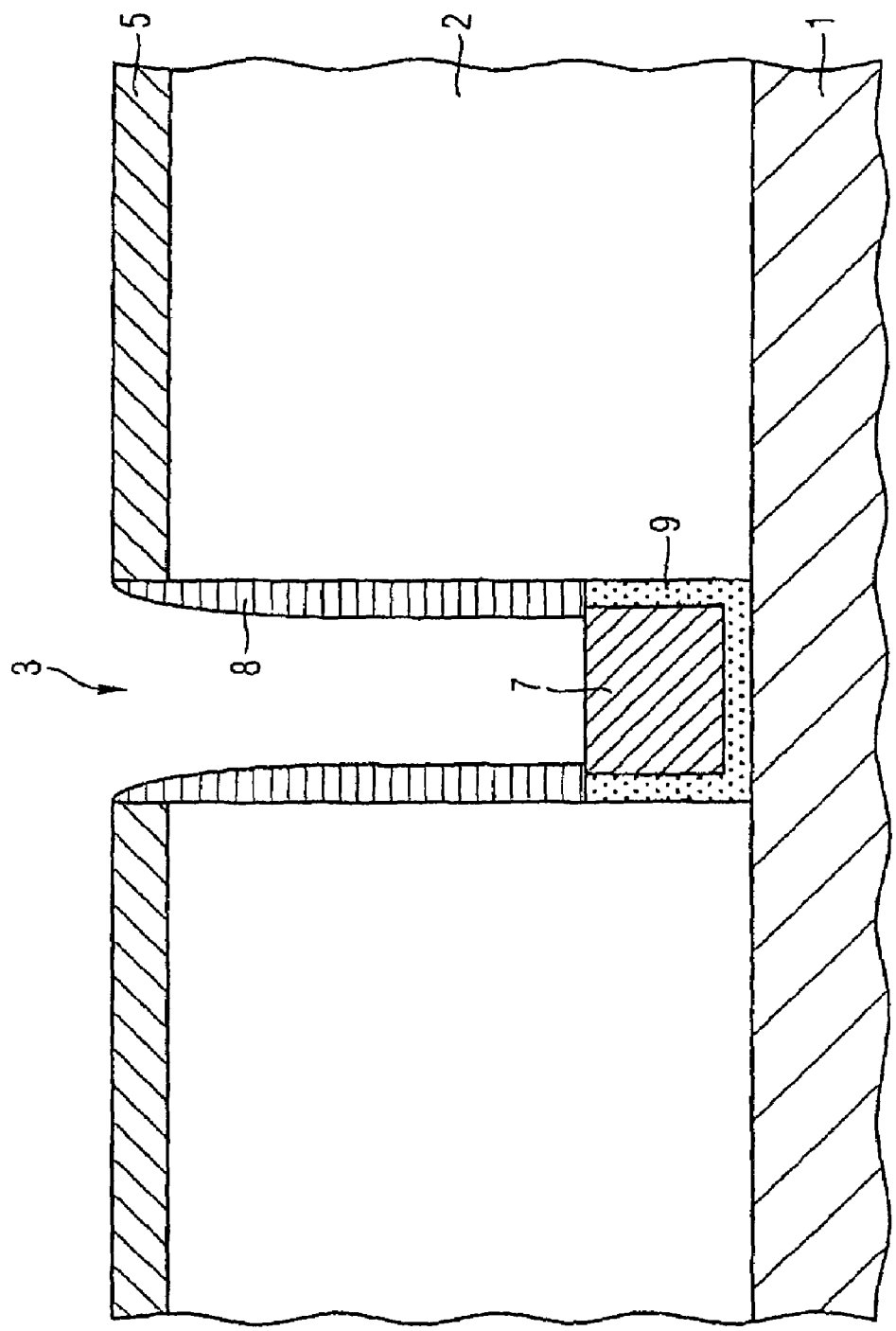
Figure 3A:
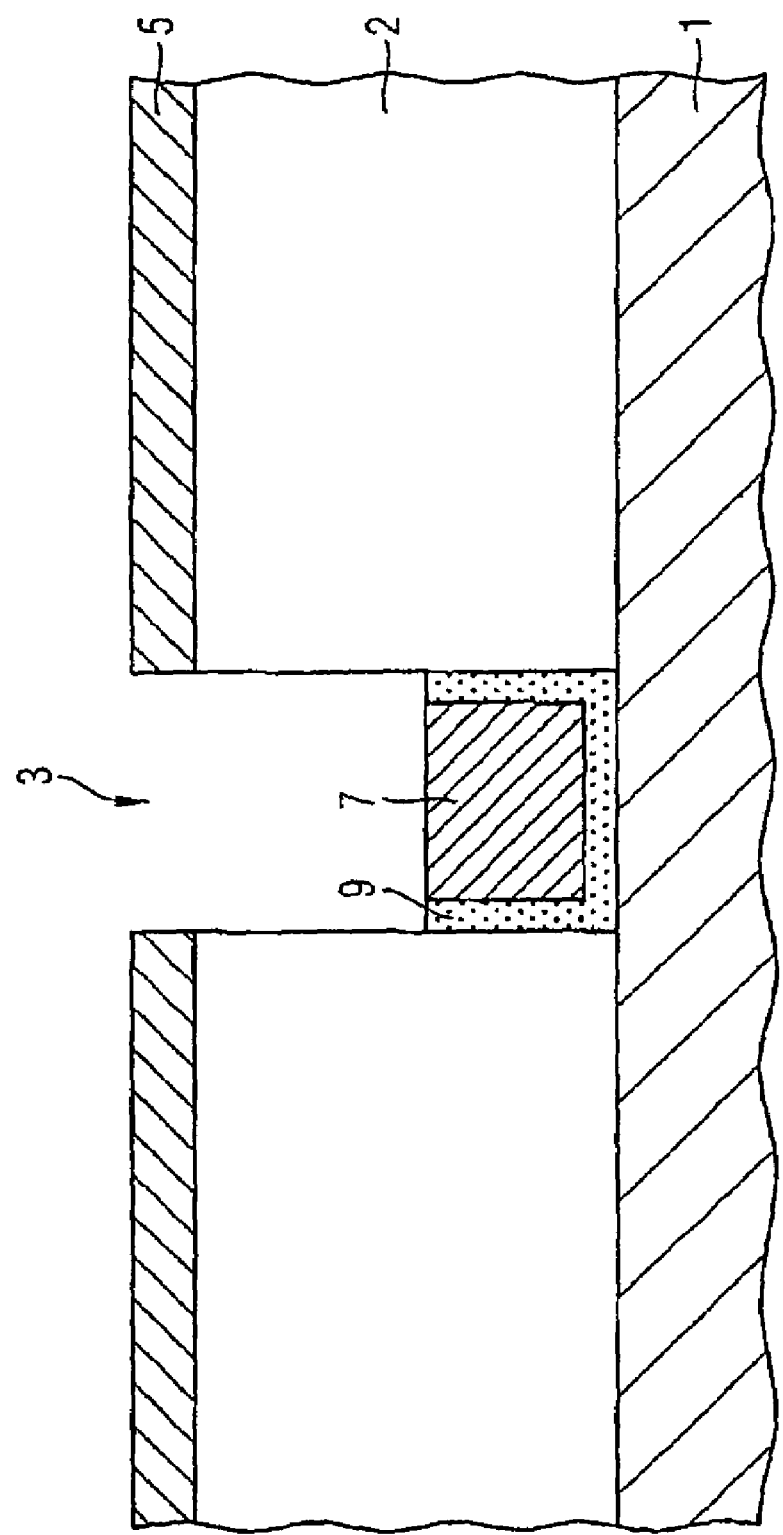

The state of the process shown in FIG. 3A corresponds to the state of the process according to FIG. 1A or 2A.

Figure 3B:
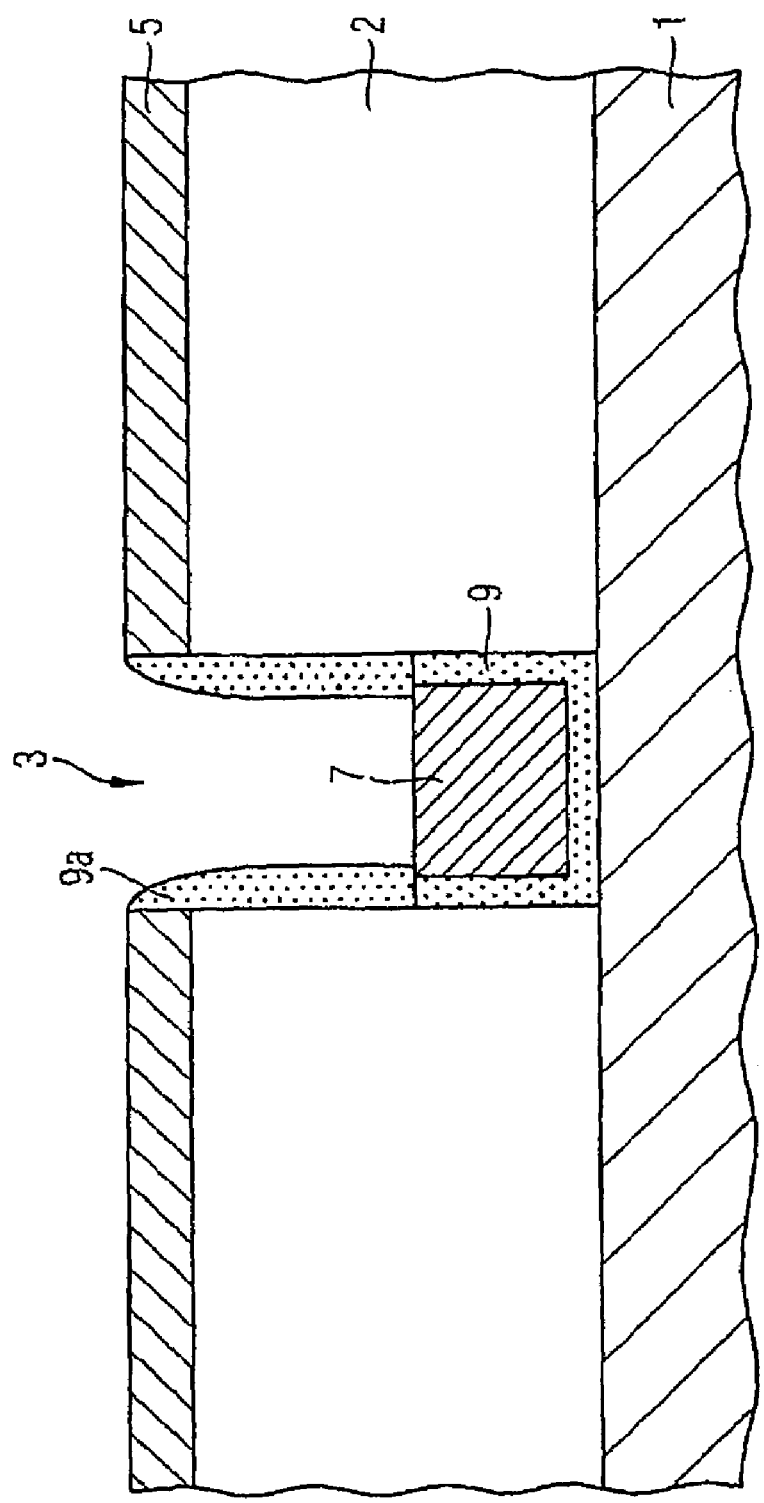

The state of the process according to FIG. 3B corresponds to the state of the process according to FIG. 1B.

As represented in FIG. 3C, in the case of this embodiment a layer of silicon oxide is likewise deposited over the resulting structure and etched back, in order to form an insulating plug 10". However, the etching-back in the case of this third embodiment is carried out only to just below the surface of the silicon nitride layer 5, to be precise it already ends in the narrowed region of the titanium nitride spacer 9a.

Figure 3D:
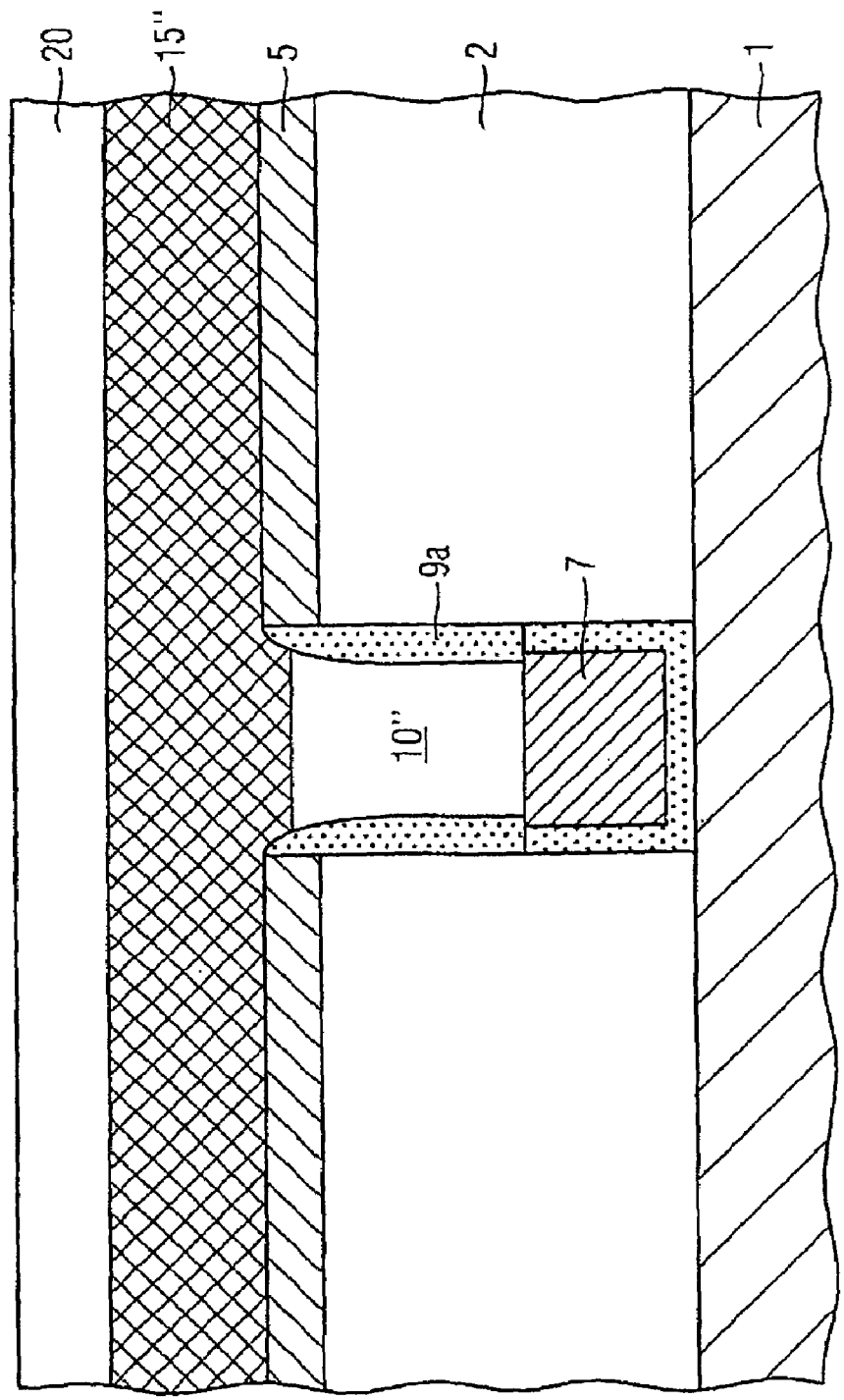

Furthermore, with reference to FIG. 3D, a layer 15" of PCM material is then deposited over the resulting structure and the second wiring plane 20 of metal is formed from it.

In the case of this embodiment, the PCM region 15" therefore covers over the silicon nitride layer 5 in the vicinity of the through-hole 3.

FIGS. 4A-E show schematic representations of successive method stages of a method of producing a contact structure for a PCM memory element as a fourth embodiment of the present invention.

Figure 4A:
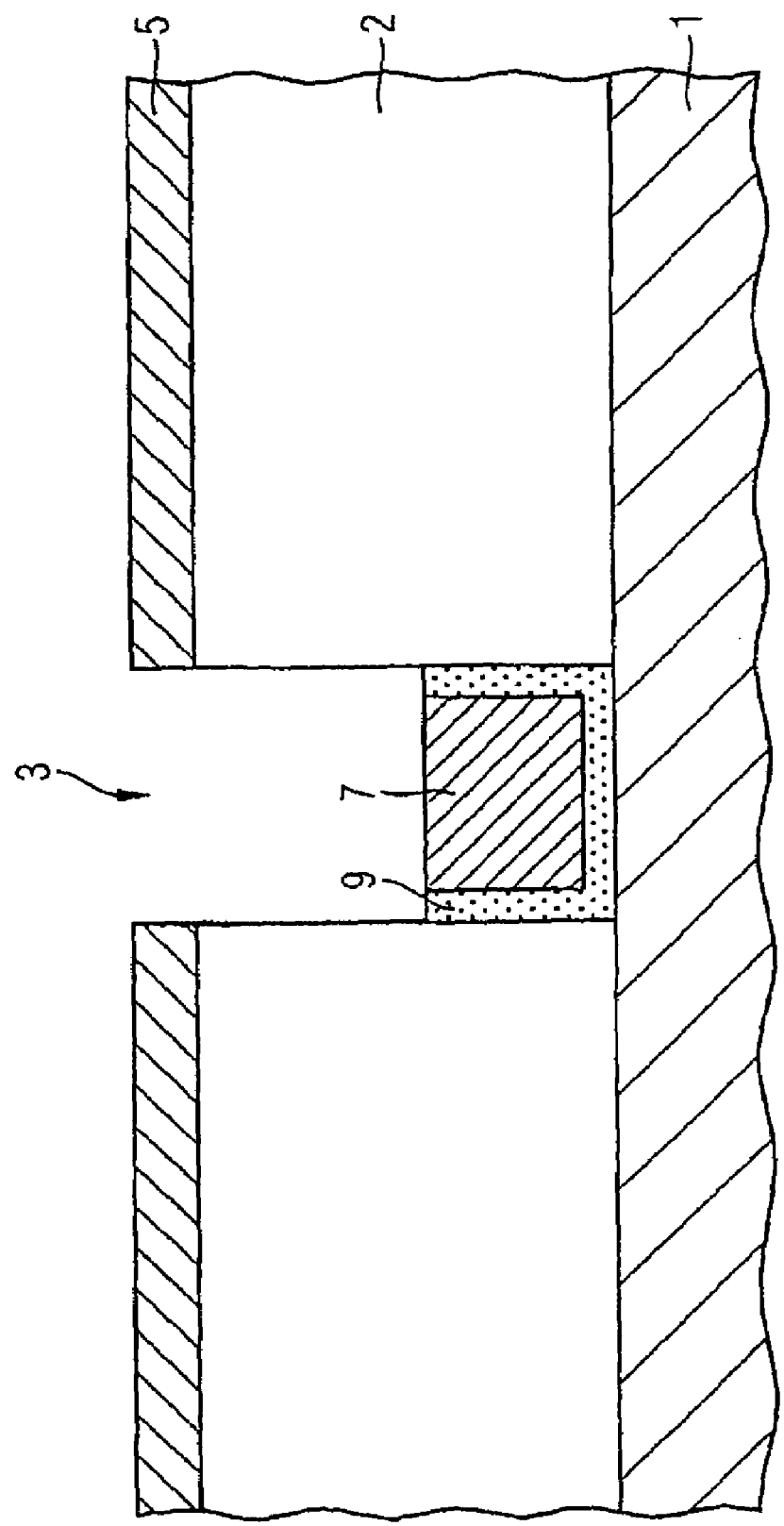
FIG. 4A-4E are schematic representations of successive method stages of a method of producing a contact structure for a PCM memory element as a fourth embodiment of the present invention.
Figure 4B:
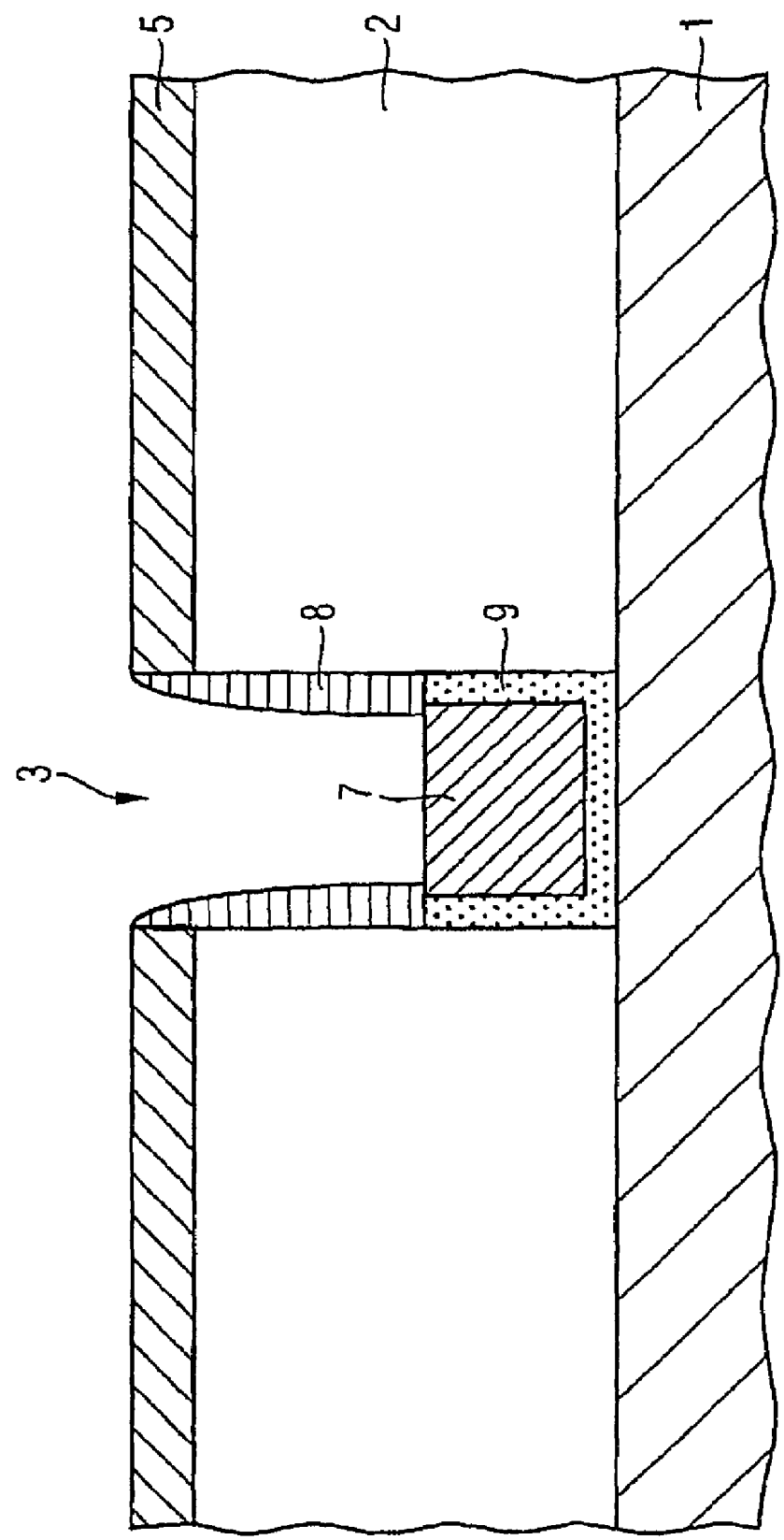
Figure 4C:
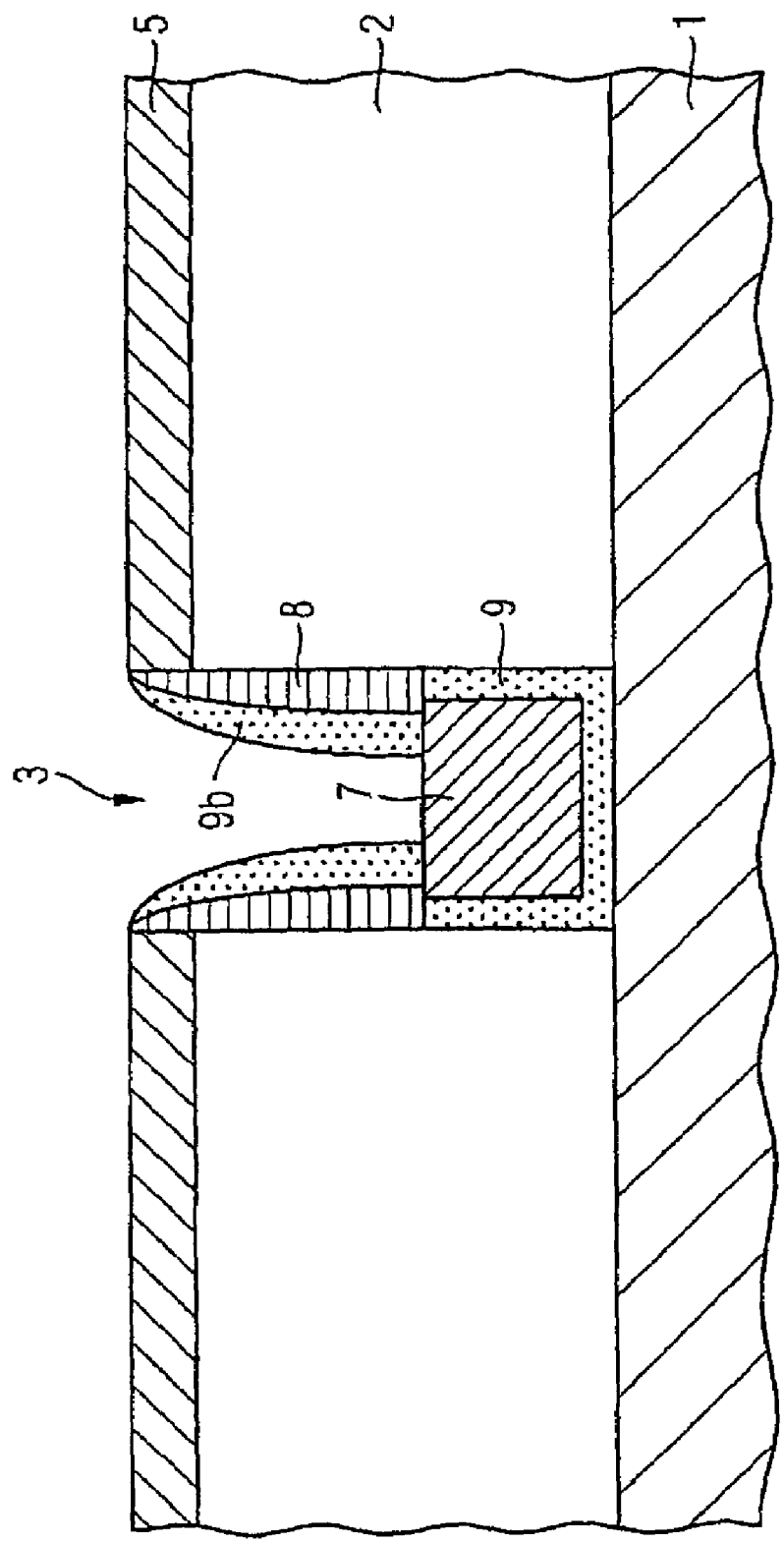

The state of the process as shown in FIG. 4A corresponds to the state of the process according to FIG. 1A, and the state of the process shown in FIG. 4B corresponds to the state of the process according to FIG. 2B, and the state of the process according to FIG. 4C corresponds to the state of the process according to FIG. 2C.

Figure 4D:
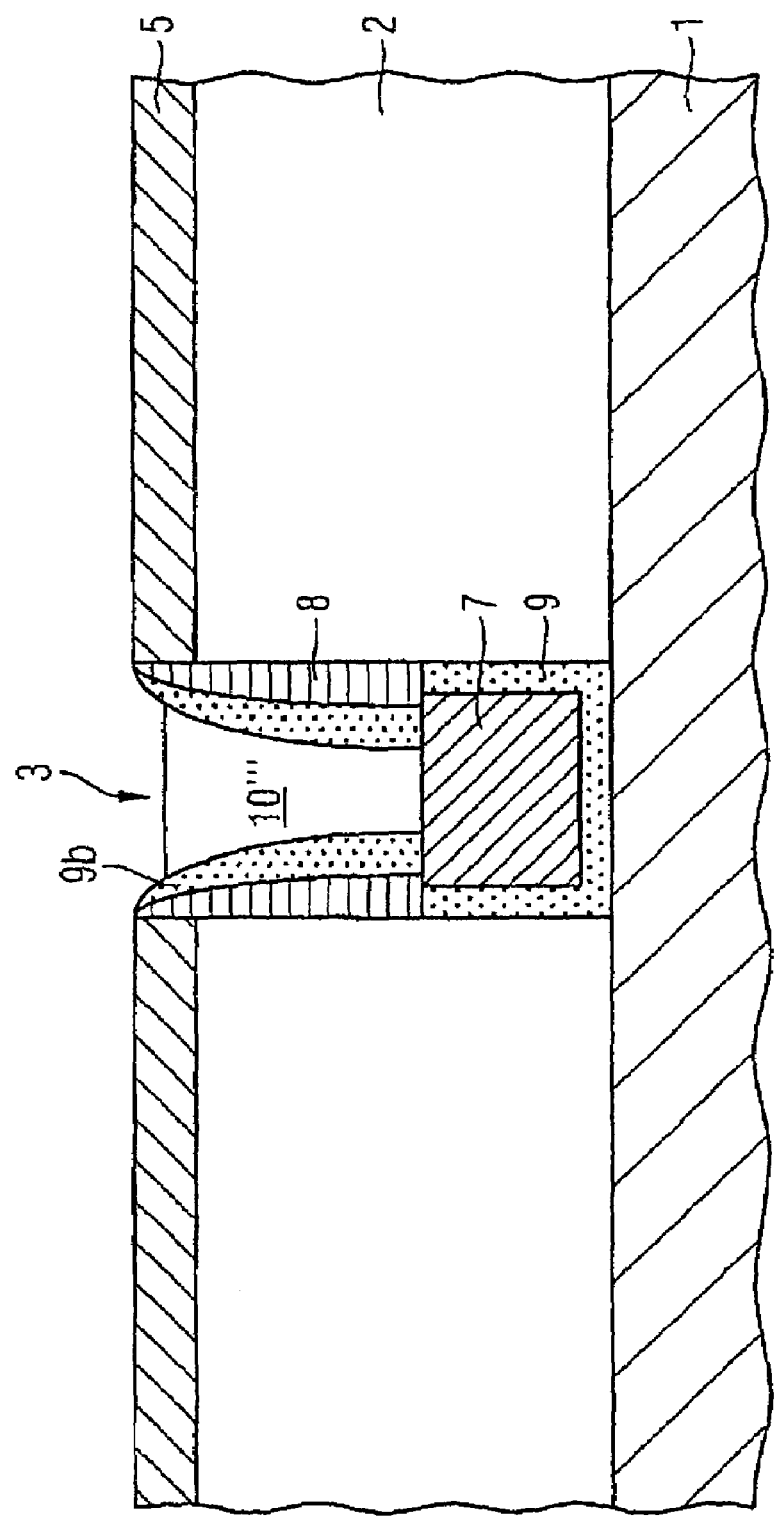

Furthermore, with reference to FIG. 4D, a layer of silicon oxide is then deposited over the resulting structure etched back to just below the surface of the silicon nitride layer 5, in order to form in the through-hole 3 an insulating plug 10''', which fills the annular titanium nitride spacer 9b.

Figure 4E:
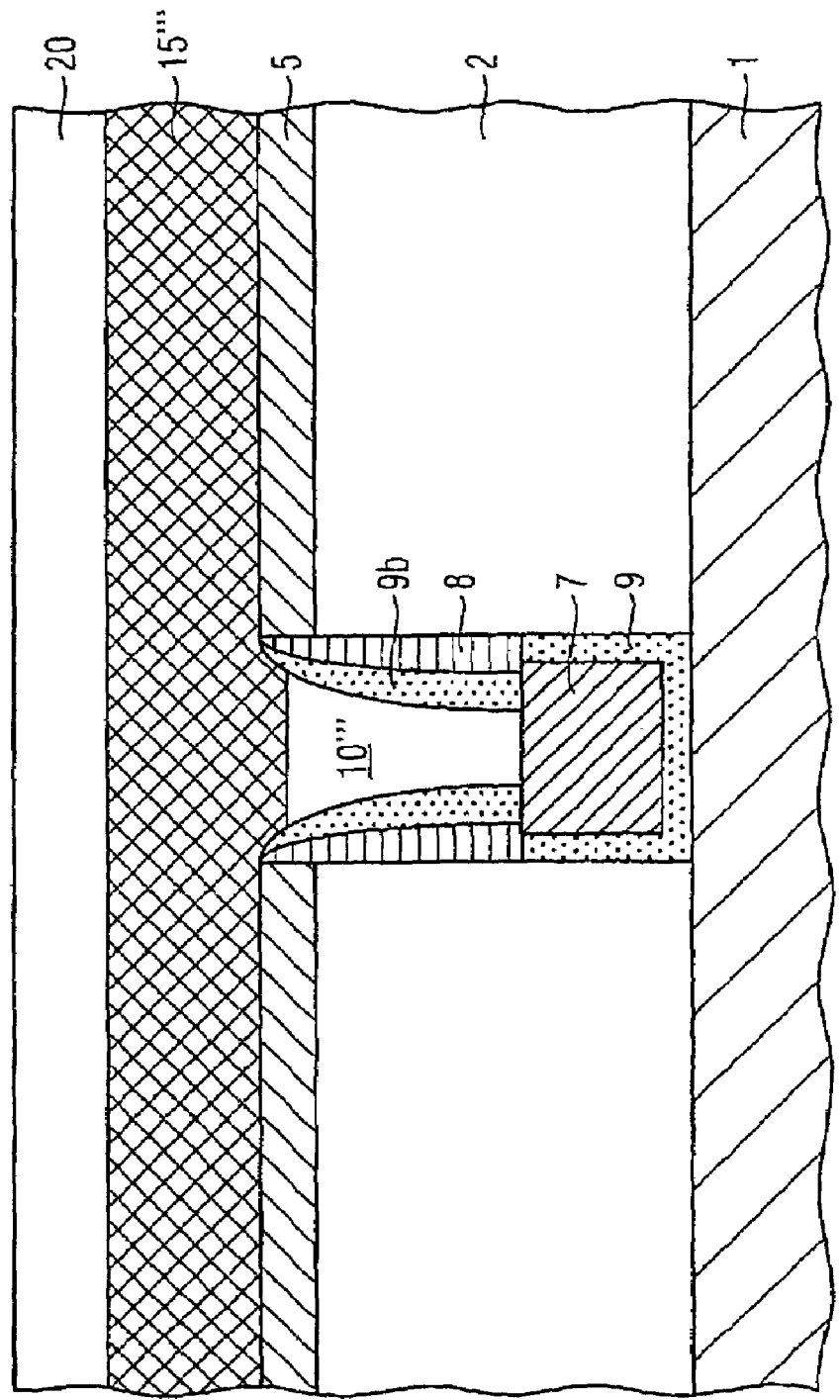

Finally, with reference to FIG. 4E, this is followed as in the case of the previously explained third embodiment by a deposition of a layer of PCM material to form the PCM region 15''' in contact with the ring electrode 9b of the titanium nitride spacer.

As in the case of the above exemplary embodiments, the second wiring plane 20 of metal is formed above the resulting structure, in order to complete the structure.

Although the present invention has been described above on the basis of preferred exemplary embodiments, it is not restricted to these but can be modified in a wide variety of ways.

In particular, the selection of the layer materials or filling materials is given only by way of example and can be varied in many ways.

Although in the case of the previous embodiments the PCM memory element has been provided between two neighboring metal planes, the present invention is not restricted to this, and the PCM memory elements according to the invention can generally be arranged between any desired conductive layers, for example between a substrate and a metal plane lying above it. Also, the region of the PCM material may be located outside the through-hole above the insulating region.

We claim as our invention:

1. A microelectronic electrode structure, comprising:
   a first wiring plane;
   an insulating region on said first wiring plane;
   a through-hole in said insulating region;
   a ring electrode in said through-hole; said ring electrode comprising a first side and a second side and said ring electrode being electrically connected on said first side to said first wiring plane by a contact plug formed in said through-hole between said first wiring plane and said ring electrode, said contact plug being adjacent to said first side of said ring electrode, and said contact plug comprising a Ti/TiN liner region and a tungsten region; and
   a second wiring plane on said insulating region, said second wiring plane being electrically connected to said second side of said ring electrode.

2. The electrode structure of claim 1, wherein said ring electrode is filled with an insulating plug.

3. The electrode structure of claim 1, comprising a region of a PCM material formed in said through-hole between said ring electrode and said second wiring plane; said region of a PCM material being adjacent to said second side of said ring electrode.

4. The electrode structure of claim 3, wherein said region of the PCM material is completely in said through-hole.

5. The electrode structure of claim 3, wherein said region of the PCM material is in said through-hole and above said insulating region.

6. The electrode structure of claim 3, wherein said region of the PCM material is outside said through-hole above said insulating region.

7. The electrode structure of claim 1, comprising a spacer-like insulating ring region formed in said through-hole between said insulating region and said ring electrode.

8. The electrode structure of claim 1, wherein said insulating region comprises a silicon oxide layer and a silicon nitride layer lying above said silicon oxide layer.

9. The electrode structure of claim 1, wherein said ring electrode is sunken into said through-hole with respect to an upper side of said insulating region.

10. The electrode structure of claim 1, being a PCM memory.

* * * * *